United States Patent
Kondo

(10) Patent No.: US 11,305,522 B2
(45) Date of Patent: Apr. 19, 2022

(54) SCREEN PRINTING METHOD AND SCREEN PRINTING MACHINE

(71) Applicant: FUJI CORPORATION, Chiryu (JP)

(72) Inventor: Takeshi Kondo, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 1 day.

(21) Appl. No.: 16/967,179

(22) PCT Filed: Feb. 16, 2018

(86) PCT No.: PCT/JP2018/005390
§ 371 (c)(1),
(2) Date: Aug. 4, 2020

(87) PCT Pub. No.: WO2019/159309
PCT Pub. Date: Aug. 22, 2019

(65) Prior Publication Data
US 2021/0046748 A1 Feb. 18, 2021

(51) Int. Cl.
*B41F 15/42* (2006.01)
*H05K 3/34* (2006.01)
(Continued)

(52) U.S. Cl.
CPC ............. *B41F 15/42* (2013.01); *B41F 15/08* (2013.01); *B41M 1/12* (2013.01); *H05K 3/3485* (2020.08)

(58) Field of Classification Search
CPC ...... B41F 15/08; B41F 15/0881; B41F 15/42; B41P 2215/50; H05K 3/3485; H05K 3/1233
See application file for complete search history.

(56) References Cited

U.S. PATENT DOCUMENTS

| | | | |
|---|---|---|---|
| 6,663,712 B2 * | 12/2003 | Doyle | H05K 3/1216 |
| | | | 118/301 |
| 2012/0085254 A1 | 4/2012 | Nagao | |
| 2019/0337287 A1* | 11/2019 | Fukakusa | B41F 15/44 |

FOREIGN PATENT DOCUMENTS

| | | |
|---|---|---|
| CN | 106313876 A | 1/2017 |
| JP | 61-168997 A | 7/1986 |

(Continued)

OTHER PUBLICATIONS

International Search Report dated Mar. 20, 2018 in PCT/JP2018/005390 filed Feb. 16, 2018, citing document AO therein, 2 pages.

*Primary Examiner* — Matthew G Marini
*Assistant Examiner* — Marissa Ferguson-Samreth
(74) *Attorney, Agent, or Firm* — Oblon, McClelland, Maier & Neustadt, L.L.P.

(57) ABSTRACT

A screen printing method of the present disclosure includes: a step of performing printing of a first viscous fluid through a screen on the first circuit board using a first squeegee and a first holding member; and a step of performing printing of a second viscous fluid through the screen on the second circuit board using a second squeegee and a second holding member. As described above, in the printing of the first viscous fluid on the first circuit board and the printing of the second viscous fluid on the second circuit board, squeegees and holding members different from each other are used, and thus, the first viscous fluid and the second viscous fluid do not mix with each other. As a result, it is possible to perform printing of different types of viscous fluids on the first circuit board and the second circuit board.

11 Claims, 7 Drawing Sheets

(51) Int. Cl.
*B41F 15/08* (2006.01)
*B41M 1/12* (2006.01)

(56) References Cited

FOREIGN PATENT DOCUMENTS

| | | | | |
|---|---|---|---|---|
| JP | 2005-199545 | * | 7/2005 | ............. B41F 15/42 |
| JP | 2008-272964 A | | 11/2008 | |
| JP | 2013-082077 | * | 6/2011 | ............. B41F 15/08 |
| JP | 2017-071072 | * | 10/2015 | ............... B41F 1/08 |
| JP | 2017-71072 A | | 4/2017 | |

* cited by examiner

SCREEN PRINTING METHOD AND SCREEN PRINTING MACHINE

TECHNICAL FIELD

The present application relates to a screen printing method and a screen printing machine for printing a viscous fluid on a circuit board.

BACKGROUND ART

Patent Literature 1 describes a screen printing machine for printing a viscous fluid through a screen on one of a first circuit board (hereinafter, the circuit board is abbreviated as a board) and a second board to be conveyed in each of the two lanes, using a pair of squeegees and a pair of holding plates. In the screen printing machine described in Patent Literature 1, the viscous fluid is printed on one of the first board and the second board using one of the pair of squeegees and one of the pair of holding plates.

PATENT LITERATURE

Patent Literature 1: JP-A-2017-71072

BRIEF SUMMARY

Technical Problem

An object of the present disclosure is to enable the printing of different types of viscous fluids on a first board and a second board to be conveyed in each of two lanes.

Solution to Problem

A screen printing method of the present disclosure includes: a step of performing printing of a first viscous fluid through a screen on a first board using a first squeegee and a first holding member; and a step of performing printing of a second viscous fluid through the screen on a second board using a second squeegee and a second holding member. As described above, in the printing of the first viscous fluid on the first board and the printing of the second viscous fluid on the second board, squeegees and holding members different from each other are used, and thus, the first viscous fluid and the second viscous fluid do not mix with each other. Therefore, it is possible to excellently perform printing of different types of viscous fluids on the first board and the second board.

The screen printing machine of the present disclosure includes: a squeegee device including a first squeegee and a second squeegee; a viscous fluid holding device including a first holding member and a second holding member; and a printing control device that controls the squeegee device and the viscous fluid holding device so as to perform printing of a first viscous fluid through the screen on the first board using the first squeegee and the first holding member, and perform printing of a second viscous fluid through the screen on the second board using the second squeegee and the second holding member. Therefore, the first board and the second board can be printed without mixing different types of viscous fluids.

DESCRIPTION OF EMBODIMENTS

Hereinafter, a screen printing machine according to an embodiment of the present disclosure will be described in detail based on the drawings. In the present screen printing machine, a screen printing method according to the embodiment of the present disclosure may be implemented. In the present embodiment, solder paste (hereinafter, simply abbreviated as solder) is used as a viscous fluid.

EXAMPLES

Figure 1:
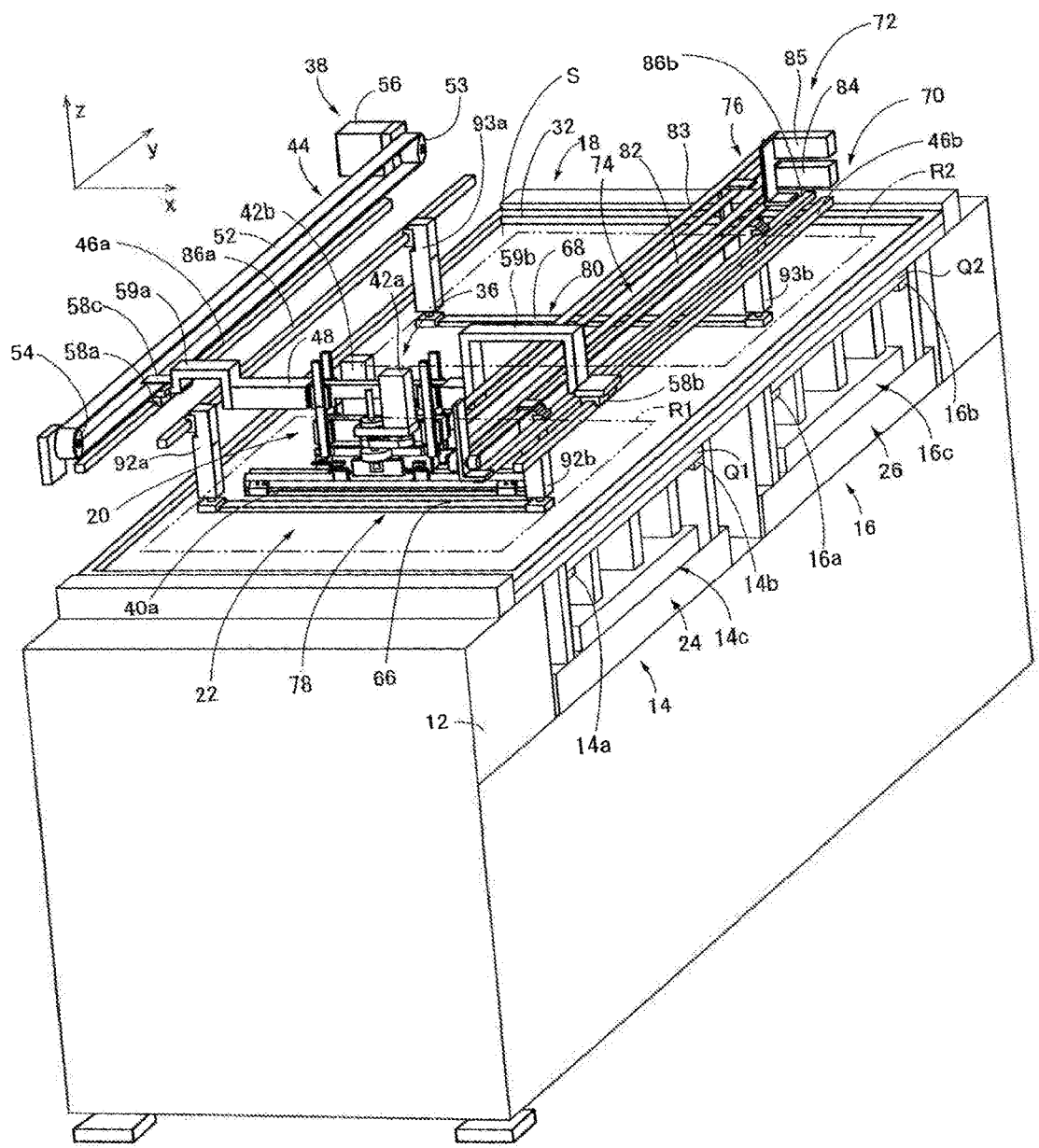
FIG. 1 is a perspective view of a screen printing machine according to an embodiment of the present disclosure. In the present screen printing machine, a screen printing method according to the embodiment of the present disclosure may be implemented.

As illustrated in FIG. 1, the screen printing machine includes main body 12, two circuit board conveyance and holding devices (hereinafter, abbreviated as board conveyance and holding device) 14 and 16, screen supporting device 18, squeegee device 20, solder collecting device 22 as a viscous fluid holding device, and the like.

Board conveyance and holding devices 14 and 16 respectively convey and hold a circuit board (hereinafter, the circuit board is simply abbreviated as a board), and are provided below screen supporting device 18 corresponding to each of first lane 24 and second lane 26. Board conveyance and holding devices 14 and 16 respectively include a pair of conveyor belts 14a and 14b, conveyor belts 16a and 16b, board holding mechanisms 14c and 16c, and the like, and first board Q1 and second board Q2 are conveyed along first lane 24 and second lane 26, and held and lifted at predetermined positions, and accordingly abut against a lower face of screen S. First lane 24 and second lane 26 are conveyance paths for first board Q1 and second board Q2, respectively, and refer to as regions between the pair of conveyor belts 14a and 14b and between the pair of conveyor belts 16a and 16b.

In the present screen printing machine, a conveyance direction of first board Q1 and second board Q2 is an x-direction, a width direction is a y-direction, and a thickness direction is a z-direction. The y-direction and the z-direction correspond to a front-rear direction and an up-down direction of the screen printing machine, respectively. The x-direction, the y-direction, and the z-direction are orthogonal to each other.

Screen supporting device 18 holds screen S in a stretched state, and includes screen frame 32 and the like for holding screen S. Screen S has a size to cover both first board Q1 and second board Q2. On screen S, both an image corresponding to first board Q1 and an image corresponding to second board Q2 are formed.

Figure 2:
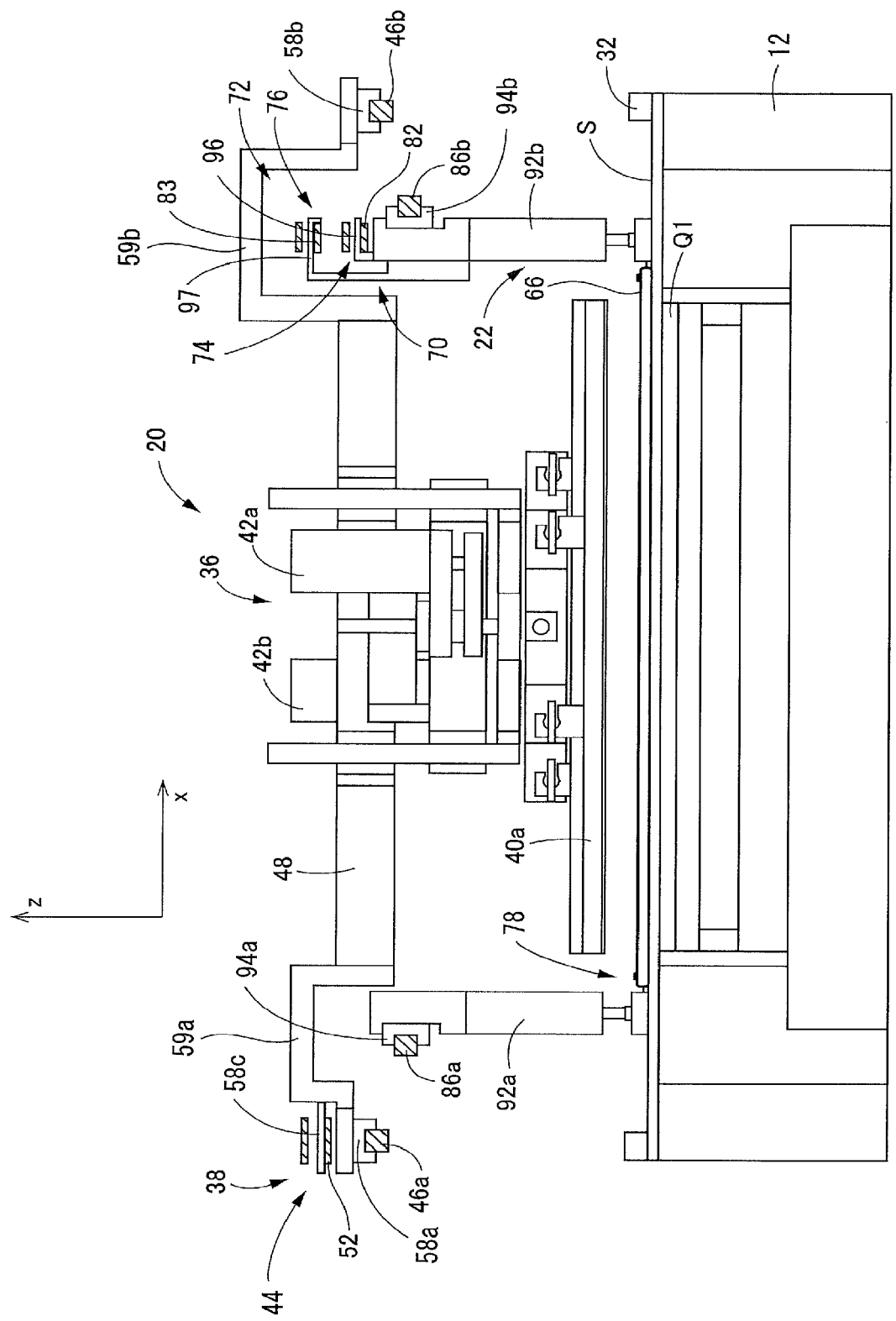
FIG. 2 is a front view of the screen printing machine.
Figure 3:
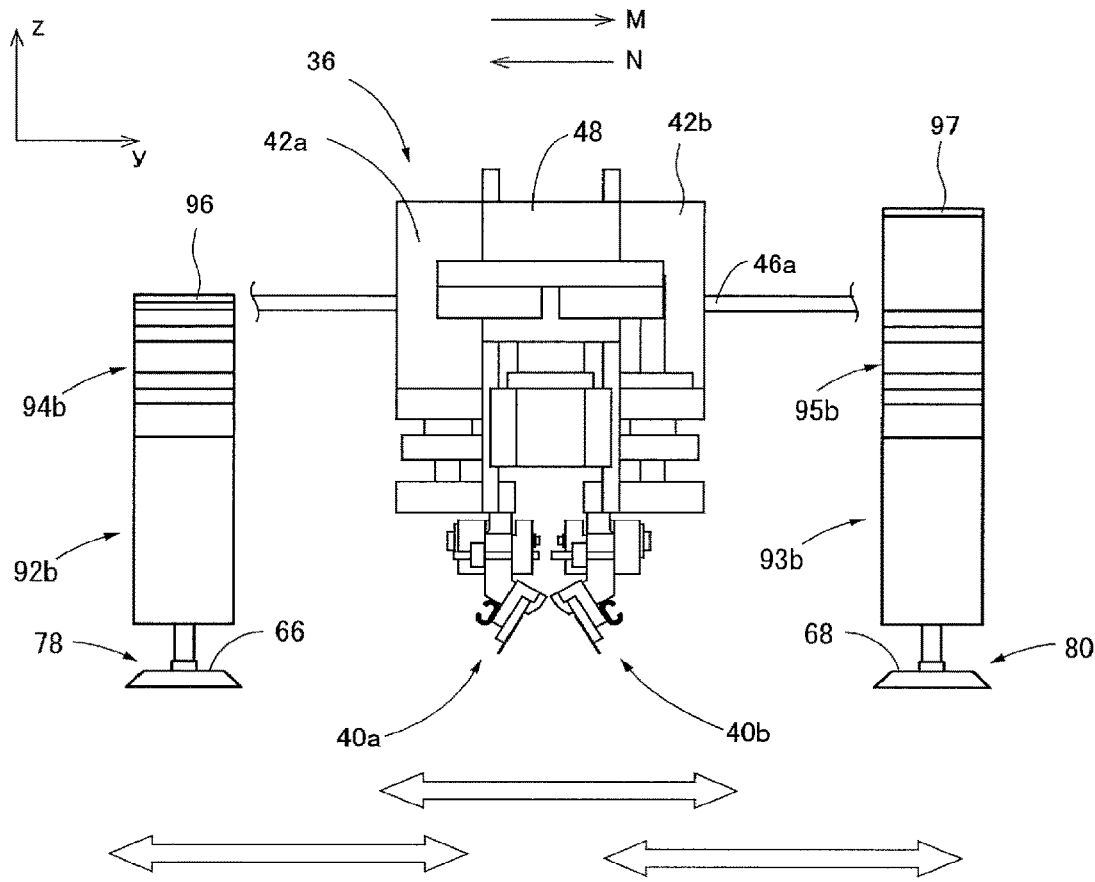
FIG. 3 is a side view of a part of the screen printing machine.

Squeegee device 20 prints solder on the board by moving the solder on the screen along the screen by a squeegee, and includes squeegee head 36, squeegee moving device 38 for moving squeegee head 36 in the y-direction, and the like, as illustrated in FIGS. 1 to 3. Squeegee head 36 includes first squeegee 40a and second squeegee 40b (hereinafter, there is a case of being abbreviated as first and second squeegees 40a and 40b and the same is applied to other members) which are a pair of squeegees positioned above screen S, and first squeegee lifting and lowering device 42a and second squeegee lifting and lowering device 42b which separately and independently lift and lower each of first squeegee 40a and second squeegee 40b.

Squeegee moving device 38 includes conveyor device 44 fixedly provided in main body 12, a pair of guide rails 46a and 46b extending in the y-direction, slider 48, and the like. Conveyor device 44 includes conveyor belt 52, a pair of pulleys including drive pulley 53 and driven pulley 54, squeegee moving motor 56, and the like. Slider 48 extends in the x-direction and includes engaging sections 58a and 58b which are provided at both end portions and engaged with a pair of guide rails 46a and 46b to be relative movable, and engaging section 58c provided at one end portion and engaged with conveyor belt 52 to be integrally movable. Further, slider 48 has curved portions 59a and 59b curved in a state of being projected upward, and has a shape that does not interfere with the movement of solder collecting device 22. Furthermore, squeegee head 36 is fixedly held by slider 48.

In squeegee device 20, squeegee moving motor 56 moves conveyor belt 52, and accordingly, squeegee head 36 is moved in the y-direction. The position and the movement amount of squeegee head 36 in the y-direction are controlled by the control of squeegee moving motor 56.

In squeegee head 36, first and second squeegees 40a and 40b respectively have a generally plate shape, and as illustrated in FIG. 3, the opposing plate surface has a posture inclined in a Λ shape when viewed from the x-direction. In other words, the plate surface of first squeegee 40a has a posture inclined in the direction advancing in first direction M indicated by arrow M in the y-direction as going upward, and the plate surface of second squeegee 40b has a posture inclined in the direction advancing in second direction N indicated by arrow N in the y-direction as going upward.

First squeegee lifting and lowering device 42a includes an air cylinder extending in the up-down direction, and first squeegee 40a is held by the piston to be integrally movable. In first squeegee lifting and lowering device 42a, the height of first squeegee 40a is controlled by the control of the relative position of the piston with respect to the cylinder main body fixedly provided on slider 48. The same is applied to second squeegee lifting and lowering device 42b, and the height of second squeegee 40b is controlled by the control of the relative position of the piston with respect to the cylinder main body in second squeegee lifting and lowering device 42.

Solder collecting device 22 holds and collects the solder on the screen, and includes first holding plate 66 and second holding plate 68 which are holding plates as two holding members, first moving device 70 for moving first holding plate 66 in the y-direction, and second moving device 72 for moving second holding plate 68 in the y-direction separately and independently from first holding plate 66. First moving device 70 includes first conveyor device 74 fixedly provided on main body 12, and first holding plate support body 78 as a slider. First conveyor device 74 includes conveyor belt 82, a pair of pulleys (not illustrated), holding plate moving motor 84, and the like. The same is applied to second moving device 72, second conveyor device 76 and second holding plate support body 80 are provided, and the second conveyor device 76 includes conveyor belt 83 provided spaced apart in the up-down direction in parallel to conveyor belt 82, a pair of pulleys (not illustrated), holding plate moving motor 85, and the like. Further, first moving device 70 and second moving device 72, in common, includes a pair of guide rails 86a and 86b extending in the y-direction.

First and second holding plate support bodies 78 and 80 are moved separately and independently in the y-direction by the first and second conveyor devices 72 and 74, respectively, but the position and the movement amount of each of the first and second holding plate support bodies 78 and 80 are controlled by the control of the holding plate moving motors 84 and 85, respectively.

Figure 4:
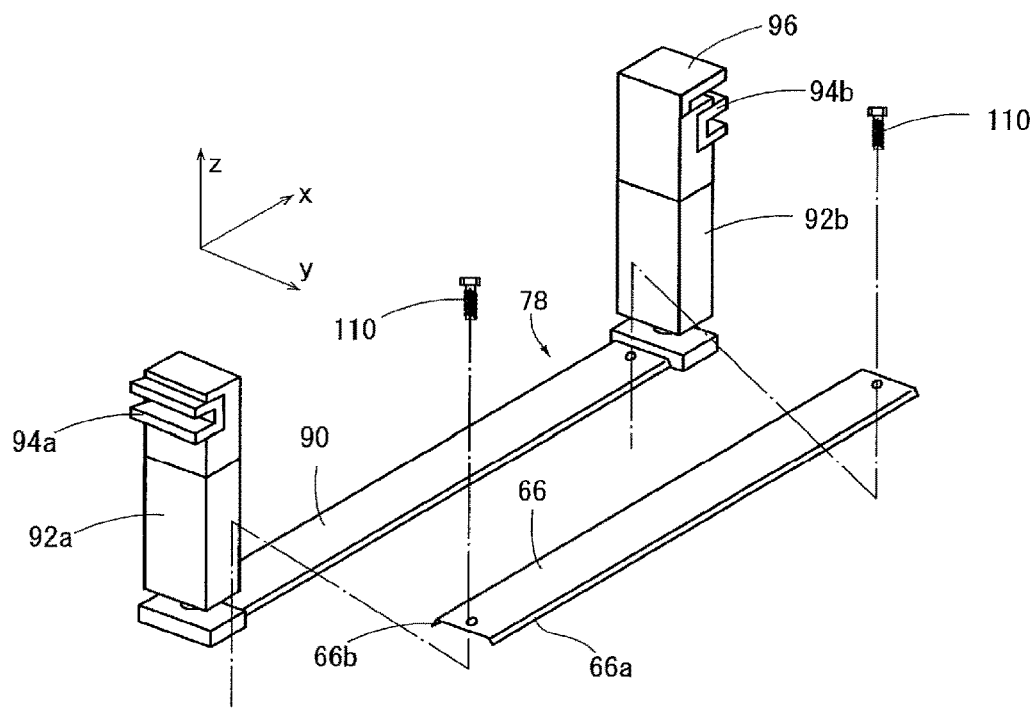
FIG. 4 is a perspective view illustrating a part of a solder collecting device of the screen printing machine.

As illustrated in FIG. 4, first holding plate support body 78 includes plate support member 90 extending in the x-direction, and a pair of lifting and lowering holding devices 92a and 92b for holding plate support member 90 to be capable of being lifted and lowered at both end portions. Lifting and lowering holding devices 92a and 92b respectively include an air cylinder extending in the up-down direction, and both end portions of plate support member 90 are held by each of the pistons to be capable of being integrally lifted and lowered. The height of plate support member 90 is controlled by the control of the relative position of the piston with respect to the cylinder main bodies in each of lifting and lowering holding devices 92a and 92b. Further, in the main bodies of lifting and lowering holding devices 92a and 92b, engaging sections 94a and 94b which are engaged with the pair of guide rails 86a and 86b to be relatively movable are provided, and in the main body of lifting and lowering holding device 92b, engaging section 96 which is engaged with conveyor belt 82 to be integrally movable is provided at a part spaced apart from engaging section 94b.

Figure 5:
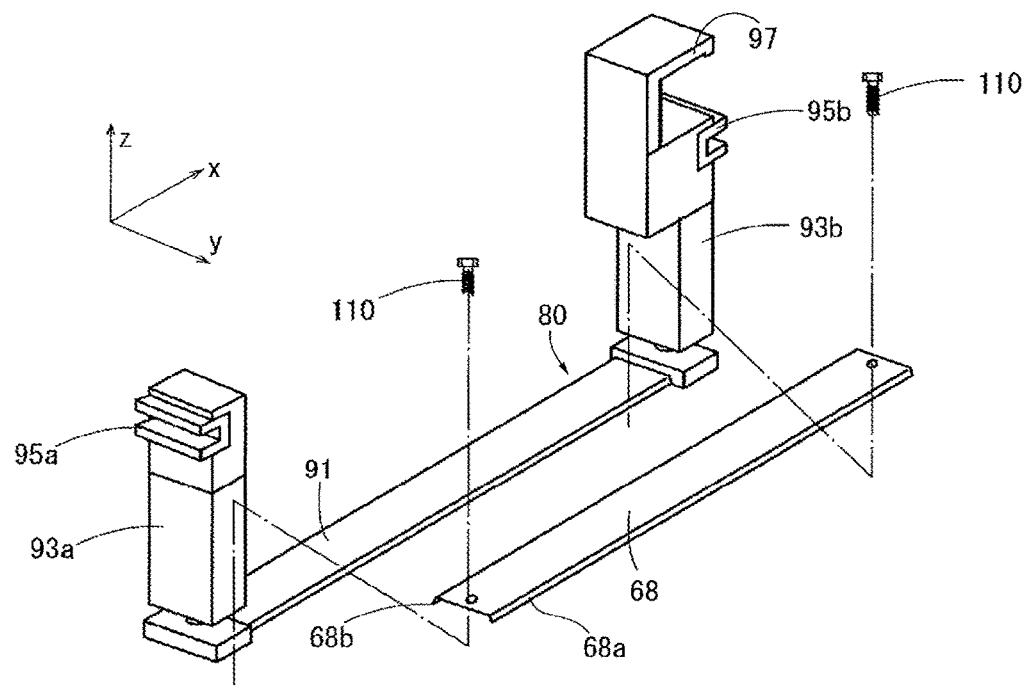
FIG. 5 is a perspective view illustrating another part of the solder collecting device.

The same is applied to second holding plate support body 80, and as illustrated in FIG. 5, plate support member 91 and lifting and lowering holding devices 93a and 93b are included, and the height of plate support member 91 is controlled by the control of the relative position of the piston with respect to the cylinder main bodies of lifting and lowering holding devices 93a and 93b. Further, in the main bodies of lifting and lowering holding devices 93a and 93b, engaging sections 95a and 95b which are engaged with the pair of guide rails 86a and 86b to be relatively movable are provided, and in the main body of lifting and lowering holding device 93b, engaging section 97 which is engaged with conveyor belt 83 to be integrally movable is provided to be spaced apart from engaging section 95b.

First holding plate 66 has a plate shape extending in the x-direction, the inclined sections 66a and 66b are respectively provided at both end portions in the width direction (y-direction). Inclined sections 66a and 66b easily lower or load the solder. The same is applied to second holding plate 68, and inclined sections 68a and 68b are provided at both end portions in the y-direction. In addition, first and second holding plates 66 and 68 are detachably attached respectively to plate support members 90 and 91 by bolt 110. Accordingly, the cleaning of first and second holding plates 66 and 68 becomes easy, and the holding and collecting work of the solder becomes easy.

Figure 6:
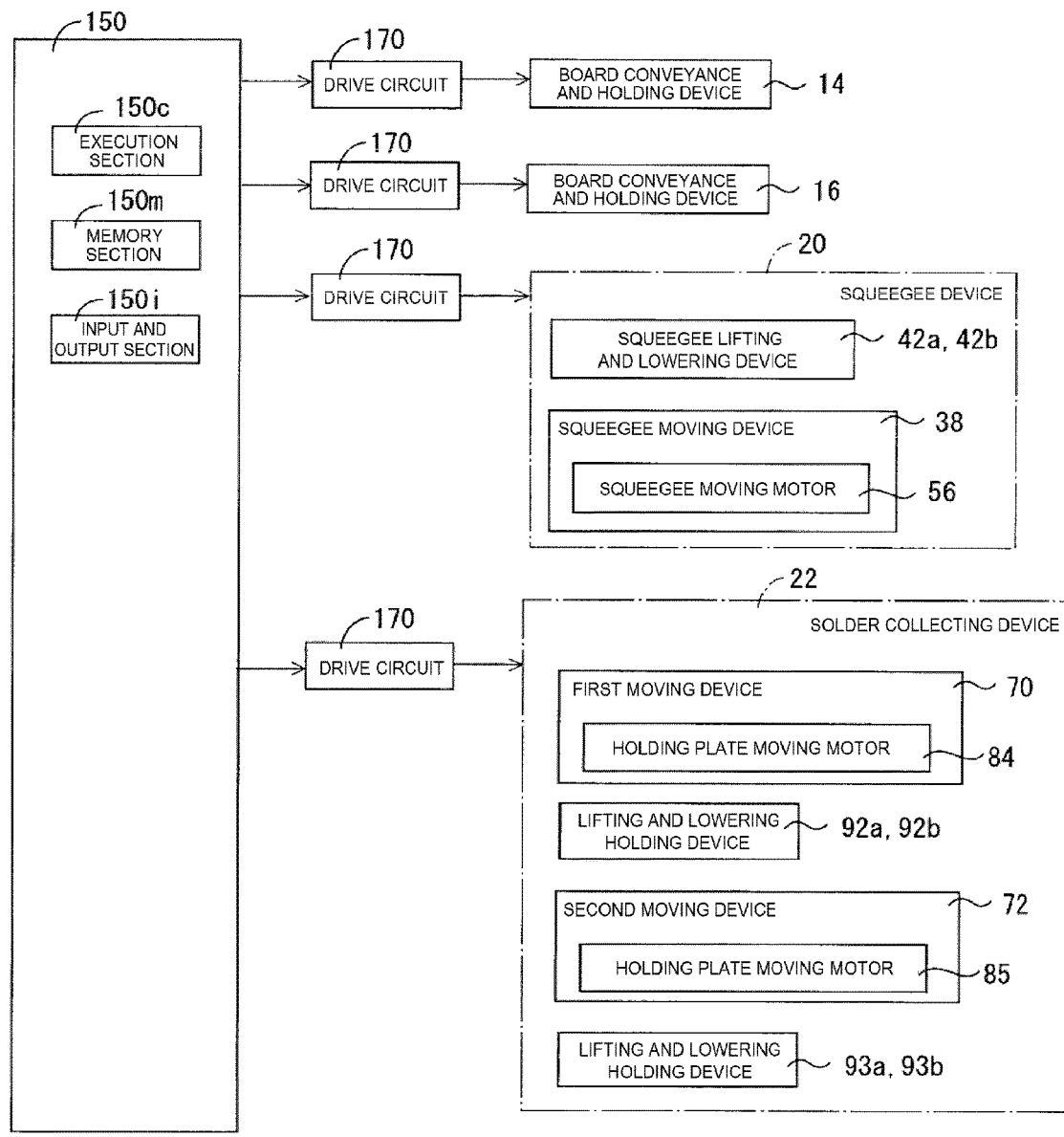
FIG. 6 is a block diagram conceptually illustrating the periphery of a control device of the screen printing machine.

As illustrated in FIG. 6, the screen printing machine includes control device 150. Control device 150 mainly includes a computer including execution section 150c, memory section 150m, input and output section 150i, and the like. Board conveyance and holding devices 14 and 16, squeegee device 20, solder collecting device 22, and the like are connected to input and output section 150i of control device 150 via drive circuit 170.

In the screen printing machine configured as described above, the screen printing of different types of solder is performed on first board Q1 and second board Q2. The solder mainly contains lead and tin, but may also contain antimony, bismuth, silver, gold, and the like. In addition, the ratio of lead and tin, and the ratio of lead, tin, and other raw materials may be different. In this manner, first solder So1 printed on first board Q1 and second solder So2 printed on second board Q2 differ from each other in at least one of the raw material that forms the solder and multiple raw material ratios.

Figure 8:
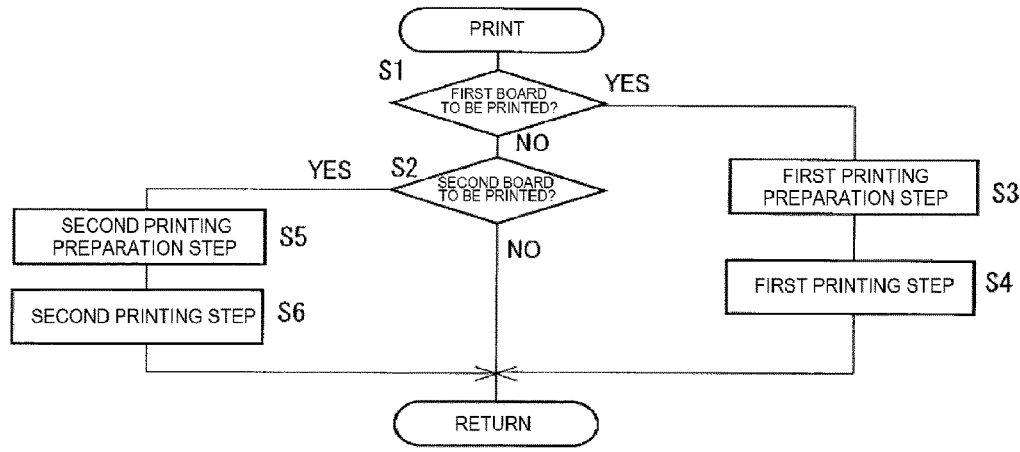
FIG. 8 is a flowchart illustrating a screen printing program stored in a memory section of the control device.

The screen printing is performed by executing a screen printing program illustrated in the flowchart of FIG. 8. In the present example, the screen printing (hereinafter, there is a case of being simply referred to as printing) is sequentially performed on the board determined in advance based on work plan information or the like, out of first board Q1 and second board Q2. In Step 1 (hereinafter, simply referred to as 51 and the same is applied to the other steps) and in Step 2, it is determined whether the board to be printed next is first board Q1 or second board Q2. When the board to be printed next is first board Q1, a first printing preparation step which is preparation for printing on first board Q1 is performed in S3, and a first printing step of printing on first board Q1 is performed in S4. Similarly, when the board to be printed next is second board Q2, a second printing preparation step and a second printing step are performed in S5 and S6.

Figure 7A:
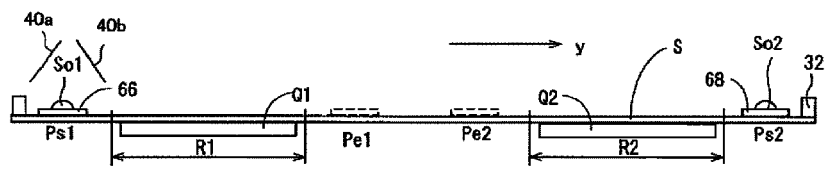
FIG. 7 is a view illustrating an operation in the screen printing machine.

First, the first and second printing steps will be described, and then, the first and second printing preparation steps will be described. When starting the first printing step, squeegee device 20 and solder collecting device 22 are in a state illustrated in FIG. 7(a) by the execution of the first printing preparation step. First holding plate 66 which holds first solder So1 and squeegee head 36 are at first start position Ps1.

Figure 7B:
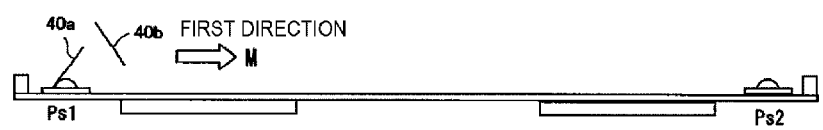
Figure 7C:
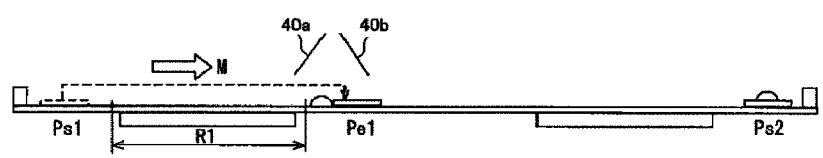
Figure 7D:
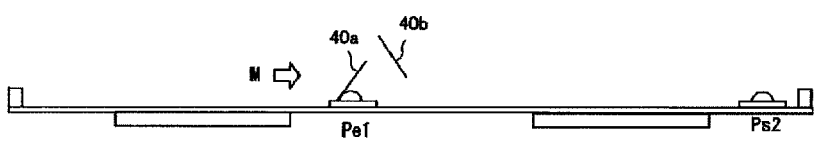
Figure 9:
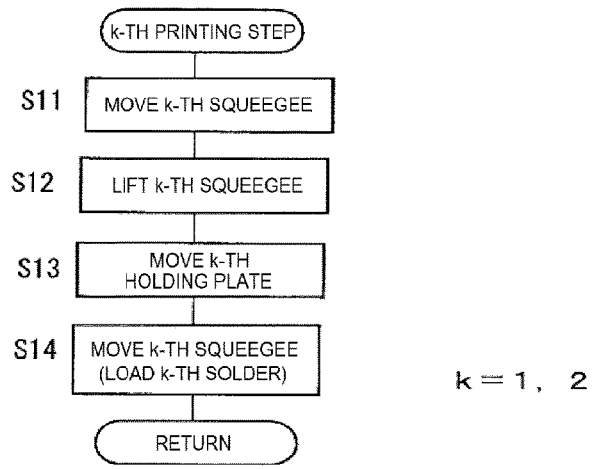
FIG. 9 is a flowchart representing a part of the screen printing program.

Each step of the first printing step is executed in the order represented by the flowchart (in which k=1) of FIG. 9. As illustrated in FIG. 7(b), first squeegee 40a is lowered by first squeegee lifting and lowering device 42a, abuts against first solder So1 held by first holding plate 66, and is moved in first direction M by squeegee moving device 38 (S11, first squeegee moving step). First solder So1 is lowered from first holding plate 66 and moved on the screen, and first solder So1 is printed on first board Q1. As illustrated in FIG. 7(c), when going beyond predetermined printing region R1 (including a region where first board Q1 is present) and reaching a predetermined position, first squeegee 40a is lifted to a retraction height (S12). Meanwhile, first holding plate 66 is lifted by lifting and lowering holding devices 92a and 92b, is moved in first direction M by first moving device 70, overtakes first squeegee 40a passing below first squeegee 40a, is moved to first end position Pe1 in front of first squeegee 40a, and is lowered (S13, first squeegee overtaking step). As illustrated in FIG. 7(d), in a state of being lowered and in contact with first solder So1, first squeegee 40a is further moved in first direction M. Accordingly, first solder So1 is loaded on first holding plates 66 (step S14, first loading step). Thereafter, first squeegee 40a is lifted to the retraction height. Thus, the printing of first solder So1 onto first board Q1 is completed, and the first printing step is completed.

Figure 7E:
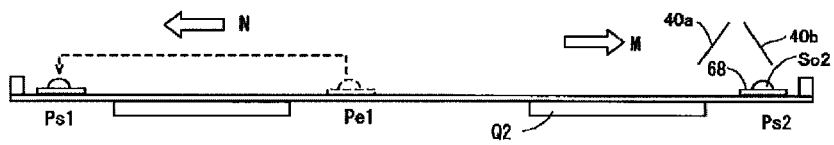

When starting second printing step, squeegee device 20 and solder collecting device 22 are a state indicated by the solid line in FIG. 7(e) by the second printing preparation step. Second holding plate 68 which holds second solder So2 and squeegee head 36 are at second start position Ps2.

Figure 7F:
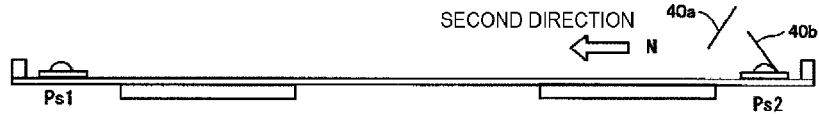
Figure 7G:
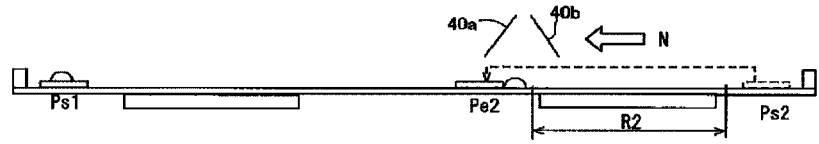
Figure 7H:
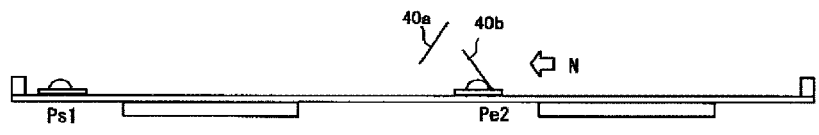

Each step of the second printing step is executed in the same manner in the order (where k=2) represented by the flowchart of FIG. 9. As illustrated in FIG. 7(f), second squeegee 40b is lowered by second squeegee lifting and lowering device 42b, and moved in second direction N by squeegee moving device 38 (S11, second squeegee moving step). Accordingly, second solder So2 held by second holding plate 68 is lowered and moved on the screen, and second solder So2 is printed on second board Q2. As illustrated in FIG. 7(g), when exceeding printing region R2 including a region where second board Q2 is present, second squeegee 40b is lifted to the retraction height (S12). Second holding plate 68 is moved in second direction N by second moving device 72, overtakes second squeegee 40b below second squeegee 40b, and is positioned at second end position Pe2 (S13, second squeegee overtaking step). As illustrated in FIG. 7(h), in a state of being lowered and in contact with second solder So2, second squeegee 40b is moved in second direction N, and second solder So2 is loaded on second holding plate 68 (S14, second loading step). Thereafter, second squeegee 40b is lifted to the retraction height. Thus, the second printing step is completed.

In addition, first and second start positions Ps1 and Ps2 are positioned on the outer sides of first lane 24 and second lane 26 of main body 12 and at a part (corresponding to both side portions in the direction in which first lane 24 and second lane 26 of main body 12 are aligned) of the outer sides of printing regions R1 and R2, first and second end positions Pe1 and Pe2 are positioned on a side spaced to be apart from each other between first lane 24 and second lane 26 and between printing region R1 and printing region R2, but first end position Pe1 is positioned on the side closer to first lane 24 than second end position Pe2.

Figure 10:
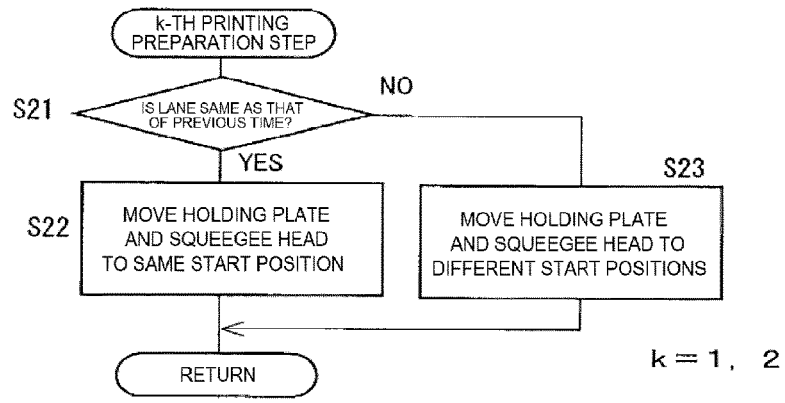
FIG. 10 is a flowchart representing another part of the screen printing program.

When the board to be printed next is second board Q2, the second printing preparation step is executed in S5. An example of the second printing preparation step is illustrated in the flowchart (where k=2) of FIG. 10. For example, when second board Q2 is printed next on first board Q1 (the determination in S21 is NO), as illustrated in FIG. 7(e), first holding plate 66 that holds first solder Po1 is moved from first end position Pe1 to first start position Ps1 in parallel with the movement of squeegee head 36 from first end position Pe1 to second start position Ps2 (second start position moving step) (S23, first holding member returning step). On the other hand, when second board Q2 is continuously printed (the determination in S21 is YES), both squeegee head 36 and second holding plate 68 that holds second solder Po2 are moved in parallel from second end position Pe2 to second start position Ps2 (S22).

Figure 7I:
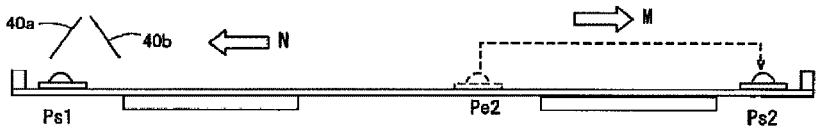

Similarly, when the board to be printed next is first board Q1, the first printing preparation step is performed in S3. An example of the first printing preparation step is illustrated by a flowchart (where k=1) of FIG. 10. For example, when the printing onto first board Q1 is performed after second board Q2 (the determination in S21 is NO), as illustrated in FIG. 7(i), second holding plate 68 that holds second solder So2 is returned from second end position Pe2 to second start position Ps2 in parallel with the movement of squeegee head 36 from second end position Pe2 to first start position Ps1

(first start position moving step) (S23, second holding member returning step). When first board Q1 is continuously printed (the determination in S21 is YES), both first holding plate 66 and squeegee head 36 are moved in parallel from first end position Pe1 to first start position Ps1 in parallel (S22).

As described above, in the present example, since the printing of first solder So1 on first board Q1 is performed using first squeegee 40a and first holding plate 66, and the printing of second solder So2 onto second board Q2 is performed using second squeegee 40b and second holding plate 68, and thus, first solder So1 and second solder So2 can be printed respectively on first board Q1 and second board Q2 without mixing first solder So1 and second solder So2 with each other.

Further, since first and second holding plates 66 and 68 can respectively overtake first and second squeegees 40a and 40b, by the movement in one direction of each of first and second squeegees 40a and 40b, on first and second holding plates 66 and 68, it is possible to lower or load the solder, and it is possible to print the solder on the board. In this manner, since the screen printing is performed on first and second boards Q1 and Q2 by the movement in one direction of first and second squeegees 40a and 40b, it is possible to stabilize the printing quality. Moreover, since it is possible to load the solder on first and second holding plates 66 and 68 using first and second squeegees 40a and 40b, it is possible to more excellently collect the solder than a case where the solder is loaded on the holding plate by the movement of the holding plate similar to the screen printing machine described in Patent Literature 1.

Furthermore, in the first printing preparation step and the second printing preparation step, the return of first and second holding plates 66 and 68 to first and second start positions and the movement of squeegee head 36 to first and second start positions are performed in parallel, and thus, it is possible to shorten the solder printing work time as compared with a case where the return and movement are performed separately.

As described above, in the present example, the execution of S13 and S14 in the flowchart of FIG. 9 corresponds to the first holding step and the second holding step. The printing control device is configured with a part of control device 150 that stores the screen printing program illustrated in the flowchart of FIG. 8, a part that executes the screen printing program, and the like. Furthermore, first holding plate support body 78 and second holding plate support body 80 correspond to the holding member support body.

In addition, in the present example, the first start position moving step, the second start position moving step, and the return of first and second holding plates 66 and 68 to first and second start positions are performed in parallel in S23, but the return of first and second holding plates 66 and 68 to first and second start positions can also be performed in parallel with the second printing step and the first printing step.

In the above-described example, the movement of first and second holding plates 66 and 68 is started after first and second squeegees 40a and 40b are lifted to the retraction height, but for example, the movement of first and second holding plates 66 and 68 can also be started at the same time as the start of the movement of first and second squeegees 40a and 40b.

Furthermore, it is not essential to provide screen S in common on first board Q1 and second board Q2, and it is also possible to provide screen S individually on first board Q1 and second board Q2.

Further, as described in Patent Literature 1, as the present disclosure can be implemented in a screen printing machine in which each of the squeegee head, the first holding plate support body, and the second holding plate support body are individually movable by individual driving motors on the pair of guide rails, the present disclosure can be implemented in a manner with various modifications and improvements based on the knowledge of a person skilled in the art.

REFERENCE SIGNS LIST

18: screen supporting device, 20: squeegee device, 22: solder collecting device, 36: squeegee head, 38: squeegee moving device, 40a: first squeegee, 40b: second squeegee, 42a: first squeegee lifting and lowering device, 42b: squeegee lifting and lowering device, 66: first holding plate, 68: second holding plate, 70: first moving device, 72: second moving device, 78: first holding plate support body, 80: second holding plate support body, 92a, 92b, 93a, 93b: lifting and lowering holding device, 150: control device

The invention claimed is:

1. A screen printing method for printing a viscous fluid through a screen on a first circuit board and a second circuit board respectively conveyed in each of two lanes using a pair of squeegees and two holding members capable of holding the viscous fluid, the method comprising:
 a first printing step of printing a first viscous fluid which is the viscous fluid on the first circuit board using a first squeegee that is one of the pair of squeegees and a first holding member that is one of the two holding members, the first printing step including:
  a first squeegee moving step of printing the first viscous fluid, being held by the first holding member at a first start position, on the first circuit board by moving the first squeegee from the first start position in a first direction, and
  a first squeegee overtaking step of moving the first holding member in the first direction below the first squeegee which is in a retracted position and move the first holding member to a first end position in front of the first squeegee after the first squeegee moving step, and
  a first loading step of lowering the first squeegee from the retracted position and moving the first squeegee in the first direction toward the first holding member positioned at the first end position to load the first viscous fluid on the first holding member, and
  a first holding step of holding the first viscous fluid by the first holding member at the first end position spaced apart from the first start position in the first direction; and
 a second printing step of printing a second viscous fluid different from the first viscous fluid on the second circuit board using a second squeegee that is the other one of the pair of squeegees and a second holding member that is the other one of the two holding members.

2. The screen printing method according to claim 1, wherein the second printing step includes
 a second squeegee moving step of printing the second viscous fluid held by the second holding member at a second start position on the second circuit board by moving the second squeegee from the second start position in a second direction opposite to the first direction, and a second holding step of holding the second viscous fluid by the second holding member at a second end position spaced apart from the second start position in the second direction, and wherein the screen printing method further comprises:

a second start position moving step of moving the pair of squeegees from the first end position to the second start position after the first printing step; and a first holding member returning step of returning the first holding member that holds the first viscous fluid from the first end position to the first start position in parallel with at least one of the second start position moving step and the second printing step.

3. The screen printing method according to claim 2, further comprising:

a first start position moving step of moving the pair of squeegees from the second end position to the first start position after the second printing step; and a second holding member returning step of returning the second holding member that holds the second viscous fluid from the second end position to the second start position in parallel with at least one of the first start position moving step and the first printing step.

4. The screen printing method according to claim 2, wherein the second holding step includes a second squeegee overtaking step of moving the second holding member in the second direction to overtake the second squeegee and move the second holding member to the second end position in front of the second squeegee after the second squeegee moving step, and a second loading step of moving the second squeegee in the second direction toward the second holding member positioned at the second end position to load the second viscous fluid on the second holding member.

5. A screen printing machine for printing a viscous fluid on a first circuit board and a second circuit board conveyed in each of two lanes through a screen, comprising:

a squeegee device configured to include a pair of squeegees and move each of the pair of squeegees on the screen;

a viscous fluid holding device configured to include two holding members capable of holding the viscous fluid and independently move each of the holding members; and a printing control device configured to control the squeegee device and the viscous fluid holding device to print a first viscous fluid which is the viscous fluid held by a first holding member that is one of the two holding members at a first start position on the first circuit board by moving a first squeegee which is one of the pair of squeegees from the first start position in a first direction, move the first holding member in the first direction below the first squeegee which is in a retracted position and move the first holding member to a first end position in front of the first squeegee, lower the first squeegee from the retracted position and move the first squeegee in the first direction toward the first holding member positioned at the first end position to load the first viscous fluid on the first holding member, hold the first viscous fluid by the first holding member at the first end position spaced apart from the first start position in the first direction, and print a second viscous fluid which is different from the first viscous fluid and held by a second holding member that is the other one of the two holding members at a second start position on the second circuit board by moving a second squeegee which is the other one of the pair of squeegees from the second start position in a second direction opposite to the first direction.

6. The screen printing machine according to claim 5, wherein the printing control device moves the second holding member in the second direction to overtake the second squeegee and move the second holding member to a second end position spaced apart from the second start position and located in front of the second squeegee after printing of the second viscous fluid on the second circuit board by the second squeegee is completed, and holds the second viscous fluid by the second holding member by moving the second squeegee in the second direction toward the second holding member positioned at the second end position.

7. The screen printing machine according to claim 5, wherein the printing control device moves the pair of squeegees from the first end position to the second start position and returns the first holding member from the first end position to the first start position in parallel with at least one of the movement of the pair of squeegees from the first end position to the second start position and the second printing step, after the first viscous fluid is held by the first holding member at the first end position, and moves the pair of squeegees from the second end position to the first start position, and returns the second holding member from the second end position to the second start position in parallel with at least one of the movement of the pair of squeegees from the second end position to the first start position and the first printing step after the second viscous fluid is held by the second holding member at the second end position.

8. The screen printing machine according to claim 5, wherein the first start position and the second start position are positioned on both side portions of a main body of the screen printing machine in a direction in which the two lanes are aligned.

9. The screen printing machine according to claim 5, wherein the viscous fluid holding device includes a first moving device capable of moving the first holding member in parallel with the pair of squeegees, and a second moving device which is separate from the first moving device and capable of moving the second holding member in parallel with the pair of squeegees, and wherein the first moving device and the second moving device include a pair of common guide members for guiding the movement of the first holding member and the second holding member.

10. The screen printing machine according to claim 5, wherein one screen is shared for the first circuit board and the second circuit board, and wherein the screen printing machine further comprises a screen supporting device for supporting the one screen.

11. The screen printing machine according to claim 5, wherein the viscous fluid holding device includes two holding member support bodies that respectively hold the two holding members, and moves each of the two holding member support bodies independently, wherein the two holding members are two holding plates each having a flat plate shape, and wherein the two holding plates are respectively detachably attached to the two holding member support bodies.

\* \* \* \* \*